(12) United States Patent
Masuo et al.

(10) Patent No.: US 7,482,840 B2
(45) Date of Patent: Jan. 27, 2009

(54) SEMICONDUCTOR INTEGRATED CIRCUIT

(75) Inventors: Akira Masuo, Osaka (JP); Norihiko Sumitani, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/525,999

(22) Filed: Sep. 25, 2006

(65) Prior Publication Data

US 2007/0080720 A1 Apr. 12, 2007

(30) Foreign Application Priority Data

Sep. 29, 2005 (JP) ............................. 2005-285125

(51) Int. Cl.
*H03K 19/096* (2006.01)
(52) U.S. Cl. .......................................... 326/97; 326/95
(58) Field of Classification Search .................. 326/93, 326/95–98, 121; 365/203, 230.06
See application file for complete search history.

(56) References Cited

U.S. PATENT DOCUMENTS

| | | |
|---|---|---|
| 3,760,380 A | 9/1973 | Hoffman et al. |
| 5,258,956 A | 11/1993 | Ahn et al. |
| 5,808,956 A | 9/1998 | Maruyama |
| 5,878,269 A | 3/1999 | Eitrheim et al. |
| 6,031,769 A | 2/2000 | Kim |
| 6,075,386 A * | 6/2000 | Naffziger ...................... 326/98 |
| 6,346,831 B1 * | 2/2002 | Krishnamurthy et al. ...... 326/98 |
| 6,597,201 B1 * | 7/2003 | Parris et al. .................... 326/93 |
| 6,978,387 B2 * | 12/2005 | Bosshart ....................... 713/300 |
| 7,027,345 B2 * | 4/2006 | Nedovic et al. ............. 365/226 |
| 7,034,576 B2 * | 4/2006 | Levy et al. ..................... 326/98 |
| 7,173,456 B2 * | 2/2007 | Lundberg ...................... 326/97 |
| 7,429,880 B2 * | 9/2008 | Rana et al. ..................... 326/98 |

FOREIGN PATENT DOCUMENTS

JP 2003-318727 A 11/2003

* cited by examiner

*Primary Examiner*—Rexford Barnie
*Assistant Examiner*—Christopher Lo
(74) *Attorney, Agent, or Firm*—McDermott Will & Emery LLP

(57) ABSTRACT

The semiconductor integrated circuit includes: a first transistor of a first conductivity type connected between a first power supply and an output node and turned ON according to a first clock to put the output node to a first logic level; a second transistor of a second conductivity type turned ON according to an input signal; a third transistor of the second conductivity type connected in series to the second transistor and turned ON according to a second clock; and a fourth transistor of the first conductivity type connected between the first power supply and the output node and turned ON according to a feedback signal. The second and third transistors are connected between the output node and a second power supply. The fourth transistor is turned from ON to OFF after both the second and third transistors are turned ON.

41 Claims, 12 Drawing Sheets

SEMICONDUCTOR INTEGRATED CIRCUIT

BACKGROUND OF THE INVENTION

The present invention relates to a dynamic semiconductor integrated circuit, and more particularly, to achievement of speedup and malfunction protection during low-voltage operation.

Dynamic circuits are used for circuits requiring high-speed operation such as memory circuits. Use of static circuits for such circuits will increase the gate capacitance preventing high-speed operation.

A semiconductor integrated circuit using a dynamic circuit is disclosed in Japanese Laid-Open Patent Publication No. 2003-318727. The disclosed circuit is provided with a hold circuit having an inverter and a p-channel metal oxide semiconductor (PMOS) transistor for protection against a malfunction. The input terminal of the inverter is connected to an output node, the gate of the PMOS transistor is connected to the output of the inverter, and the drain of the PMOS transistor is connected to the output node, so that the PMOS transistor can supply charge to the output node.

Assume that such a semiconductor integrated circuit is used for a circuit for decoding an address, for example. When the capability of the PMOS transistor of the hold circuit is increased, occurrence of a malfunction can be prevented if the address misses in the decoding circuit (that is, if the potential of the precharged output node is kept high). However, if the address hits in the circuit (that is, if the potential of the precharged output node must be lowered), the following problem occurs when the power supply voltage is low, in particular. That is, the charge at the output node cannot be drawn sufficiently with an n-channel metal oxide semiconductor (NMOS) transistor, and thus speedup of the operation fails.

When the capability of the PMOS transistor of the hold circuit is reduced, the charge at the output node can be drawn even when the power supply voltage is low if the address hits in the circuit. However, if the address misses in the circuit, a glitch may grow and cause the possibility of a malfunction.

SUMMARY OF THE INVENTION

An object of the present invention is providing a dynamic semiconductor integrated circuit capable of achieving both speedup and malfunction protection during low-voltage operation.

The first semiconductor integrated circuit of the present invention includes: a first transistor of a first conductivity type connected between a first power supply and an output node, the first transistor being turned ON according to a first clock to put the output node to a first logic level; a second transistor of a second conductivity type, the second transistor being turned ON according to an input signal; a third transistor of the second conductivity type connected in series to the second transistor, the third transistor being turned ON according to a second clock; a fourth transistor of the first conductivity type connected between the first power supply and the output node, the fourth transistor being turned ON according to a feedback signal; an inverter for outputting a signal inverted in logic level from the output node; and a fifth transistor of the first conductivity type connected between the first power supply and the output node, the fifth transistor being turned ON according to the output of the inverter, wherein the second and third transistors are connected between the output node and a second power supply, and the fourth transistor is turned from ON to OFF after both the second and third transistors are turned ON.

With the configuration described above, the fourth transistor permits conduction between the first power supply and the output node even after the second and third transistors are turned ON. Hence, occurrence of a glitch at the output node can be suppressed, and thus occurrence of a malfunction can be prevented. Also, once being turned OFF, the fourth transistor does not permit conduction between the first power supply and the output node, letting the output node change its potential. Hence, the operation speed is prevented from decreasing even during low-voltage operation.

The second semiconductor integrated circuit of the present invention includes: first and second output circuits; first and second decode circuits each for determining whether or not an input value matches with a predetermined value and outputting the determination result; and first and second delay circuits, wherein the first output circuit includes: a first transistor of a first conductivity type connected between a first power supply and a first output node, the first transistor being turned ON according to a first clock to put the first output node to a first logic level; a second transistor of a second conductivity type, the second transistor being turned ON according to a signal indicating the determination result from the first decode circuit; a third transistor of the second conductivity type connected in series to the second transistor, the third transistor being turned ON according to a second clock; a fourth transistor of the first conductivity type connected between the first power supply and the first output node, the fourth transistor being turned ON according to a first feedback signal; a first inverter for inverting the logic level of the first output node and outputting the inverted signal; and a fifth transistor of the first conductivity type connected between the first power supply and the first output node, the fifth transistor being turned ON according to the output of the first inverter or the signal indicating the determination result from the first decode circuit, the second and third transistors being connected between the first output node and a second power supply, wherein the second output circuit includes: a sixth transistor of the first conductivity type connected between the first power supply and a second output node, the sixth transistor being turned ON according to the first clock to put the second output node to the first logic level; a seventh transistor of the second conductivity type, the seventh transistor being turned ON according to a signal indicating the determination result from the second decode circuit; an eighth transistor of the second conductivity type connected in series to the seventh transistor, the eighth transistor being turned ON according to the second clock; a ninth transistor of the first conductivity type connected between the first power supply and the second output node, the ninth transistor being turned ON according to a second feedback signal; a second inverter for inverting the logic level of the second output node and outputting the inverted signal; and a tenth transistor of the first conductivity type connected between the first power supply and the second output node, the tenth transistor being turned ON according to the output of the second inverter or the signal indicating the determination result from the second decode circuit, the seventh and eighth transistors being connected between the second output node and the second power supply, and wherein the first delay circuit delays the signal indicating the determination result from the first decode circuit and outputs the delayed signal as the second feedback signal, and the second delay circuit delays the signal indicating the determination result from the second decode circuit and outputs the delayed signal as the first feedback signal.

The third semiconductor integrated circuit of the present invention includes: first, second and third output circuits; first, second and third decode circuits each for determining whether or not an input value matches with a predetermined value and outputting the determination result; and first and second delay circuits, wherein the first output circuit includes: a first transistor of a first conductivity type connected between a first power supply and a first output node, the first transistor being turned ON according to a first clock to put the first output node to a first logic level; a second transistor of a second conductivity type, the second transistor being turned ON according to a signal indicating the determination result from the first decode circuit; a third transistor of the second conductivity type connected in series to the second transistor, the third transistor being turned ON according to a second clock; a fourth transistor of the first conductivity type connected between the first power supply and the first output node, the fourth transistor being turned ON according to a first feedback signal; a first inverter for inverting the logic level of the first output node and outputting the inverted signal; and a fifth transistor of the first conductivity type connected between the first power supply and the first output node, the fifth transistor being turned ON according to the output of the first inverter or the signal indicating the determination result from the first decode circuit, the second and third transistors being connected between the first output node and a second power supply, wherein the second output circuit includes: a sixth transistor of the first conductivity type connected between the first power supply and a second output node, the sixth transistor being turned ON according to the first clock to put the second output node to the first logic level; a seventh transistor of the second conductivity type, the seventh transistor being turned ON according to a signal indicating the determination result from the second decode circuit; an eighth transistor of the second conductivity type connected in series to the seventh transistor, the eighth transistor being turned ON according to the second clock; a ninth transistor of the first conductivity type connected between the first power supply and the second output node, the ninth transistor being turned ON according to a second feedback signal; a second inverter for inverting the logic level of the second output node and outputting the inverted signal; and a tenth transistor of the first conductivity type connected between the first power supply and the second output node, the tenth transistor being turned ON according to the output of the second inverter or the signal indicating the determination result from the second decode circuit, the seventh and eighth transistors being connected between the second output node and the second power supply, wherein the third output circuit includes: an eleventh transistor of the first conductivity type connected between the first power supply and a third output node, the eleventh transistor being turned ON according to the first clock to put the third output node to the first logic level; a twelfth transistor of the second conductivity type, the twelfth transistor being turned ON according to a signal indicating the determination result from the third decode circuit; a thirteenth transistor of the second conductivity type connected in series to the twelfth transistor, the thirteenth transistor being turned ON according to the second clock; a fourteenth transistor of the first conductivity type connected between the first power supply and the third output node, the fourteenth transistor being turned ON according to a third feedback signal; a third inverter for inverting the logic level of the third output node and outputting the inverted signal; and a fifteenth transistor of the first conductivity type connected between the first power supply and the third output node, the fifteenth transistor being turned ON according to the output of the third inverter or the signal indicating the determination result from the third decode circuit, the twelfth and thirteenth transistors being connected between the third output node and the second power supply, and wherein the first delay circuit delays the signal indicating the determination result from the first decode circuit and outputs the delayed signal as the second feedback signal, and the second delay circuit delays the signal indicating the determination result from the second decode circuit and outputs the delayed signal as the third feedback signal.

According to the present invention, both speedup and malfunction protection can be achieved even when the power supply voltage is low, and thus the range of the power supply voltage with which the circuit is operable can be widened.

DESCRIPTION OF THE PREFERRED EMBODIMENTS

Hereinafter, preferred embodiments of the present invention will be described with reference to the accompanying drawings.

Figure 1:
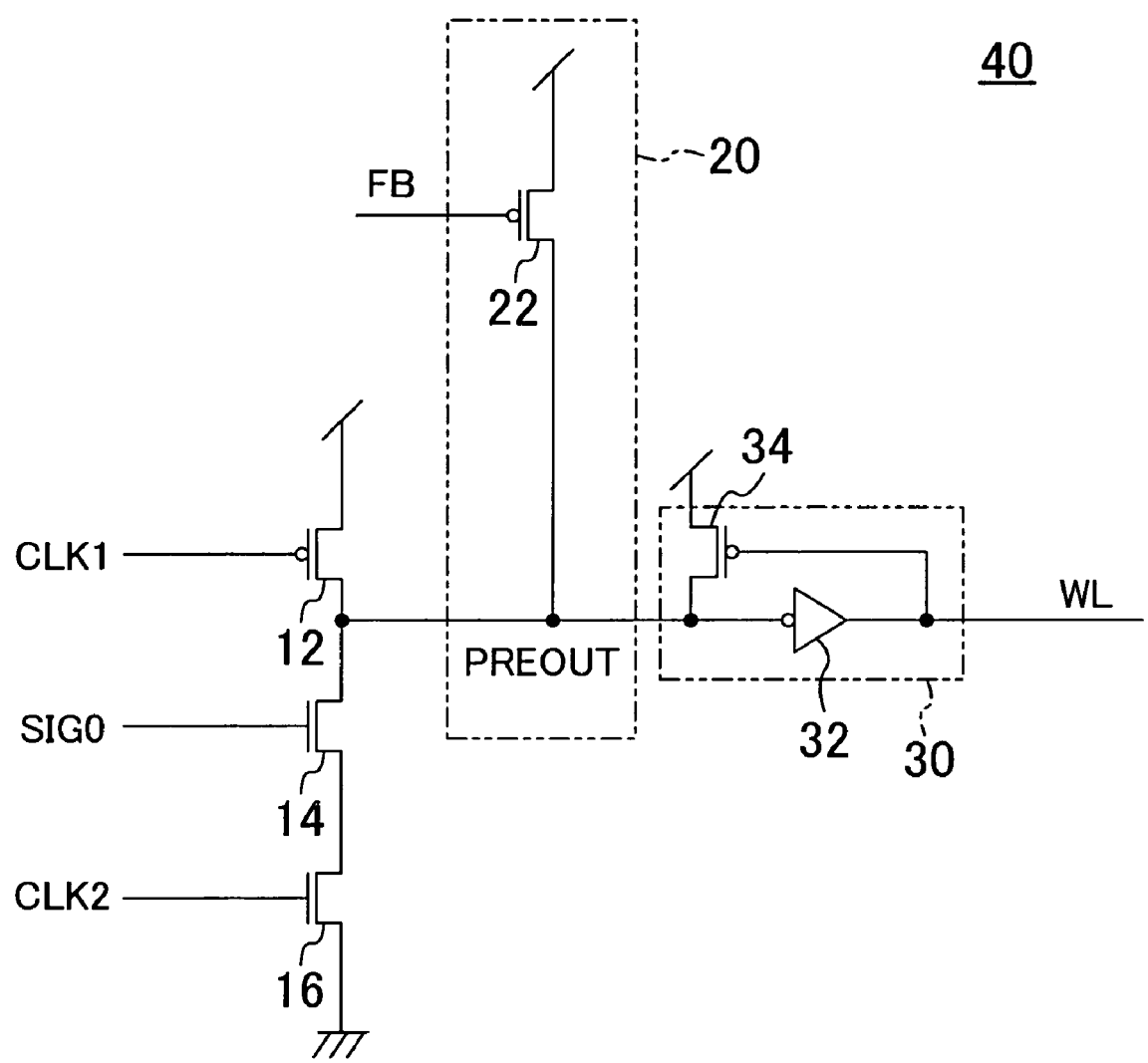
FIG. 1 is a circuit diagram of a semiconductor integrated circuit of an embodiment of the present invention.

FIG. 1 is a circuit diagram of a semiconductor integrated circuit of an embodiment of the present invention. The semiconductor integrated circuit of FIG. 1, denoted by 40, includes a PMOS transistor 12, NMOS transistors 14 and 16, a feedback circuit 20 and a hold circuit 30, constituting as a whole a dynamic circuit. The feedback circuit 20 includes a PMOS transistor 22, and the hold circuit 30 includes an inverter 32 and a PMOS transistor 34.

Clocks CLK1 and CLK2 are respectively input into the gates of the PMOS transistor 12 and the NMOS transistor 16. The clock CLK2 is synchronous with the clock CLK1. A signal SIG0 is input into the gate of the NMOS transistor 14. The NMOS transistors 14 and 16 are connected in series.

A feedback signal FB is input into the gate of the PMOS transistor 22. The feedback signal FB is a signal that shifts from a low logic level (hereinafter, simply called "L") to a high logic level (hereinafter, simply called "H") after the clock CLK2 shifts from "L" to "H", which can be a signal obtained by delaying the clock CLK2, for example. The drains of the PMOS transistors 12, 22 and 34 and the NMOS transistor 14 are connected to an output node PREOUT. The sources of the PMOS transistors 12, 22 and 34 are connected to power supply, while the source of the NMOS transistor 16 is grounded. The inverter 32 outputs a signal WL inverted in logic level from the output node PREOUT.

Figure 2:
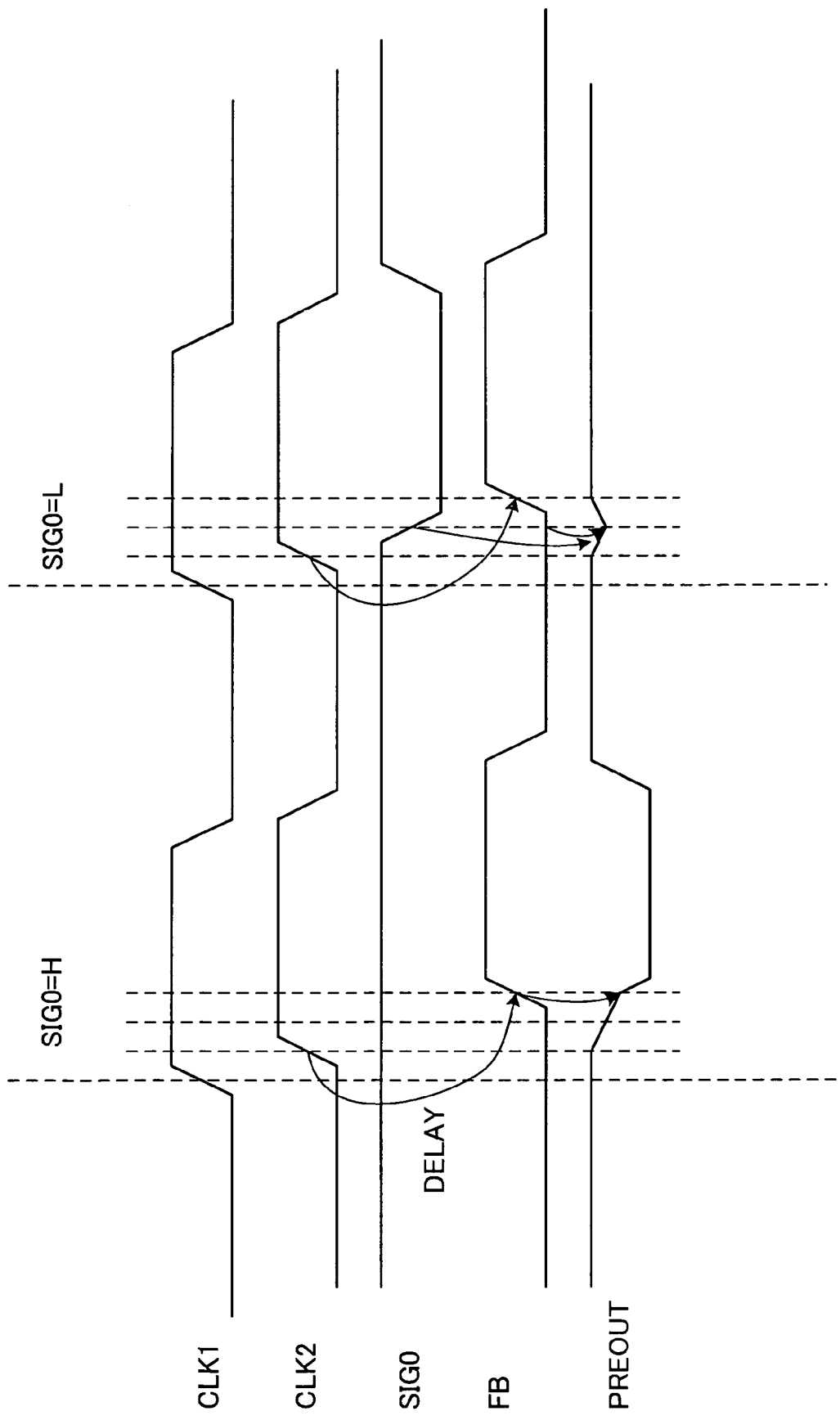
FIG. 2 is a timing chart of signals in the semiconductor integrated circuit of FIG. 1.

FIG. 2 is a timing chart of the signals in the semiconductor integrated circuit of FIG. 1. Referring to FIG. 2, the operation of the semiconductor integrated circuit 40 will be described.

The case that the signal SIG0 is "H" will be described. In this case, assuming that the clock CLK2 is "L", the NMOS transistor 16 is OFF while the NMOS transistor 14 is ON. When the clock CLK1 and the feedback signal FB are "L", the PMOS transistors 12 and 22 are ON, charging the output node PREOUT. The potential of this node is therefore "H". At this time, the output signal WL from the inverter 32 is "L", and thus the PMOS transistor 34 is ON.

Once the clock CLK1 goes "H", the PMOS transistor 12 is turned OFF. Further, once the clock CLK2 goes "H", the NMOS transistor 16 is turned ON, allowing the output node PREOUT to start discharge. The potential of this node therefore starts decreasing.

Thereafter, the feedback signal FB goes "H", turning the PMOS transistor 22 OFF. Since the driving capability of the PMOS transistor 34 is not so large, the potential of the output node PREOUT greatly decreases to become "L". The output signal WL from the inverter 32 then goes "H", turning the PMOS transistor 34 OFF.

When the clocks CLK1 and CLK2 go "L", the discharge from the output node PREOUT stops and charge to this node is started with the PMOS transistor 12. The feedback signal FB then goes "L", causing the output node PREOUT to be charged to "H" to resume the original state.

As described above, when the signal SIG0 is "H" and the clock CLK2 goes "H", both the NMOS transistors 14 and 16 are turned ON. The feedback signal FB then goes "H" turning the PMOS transistor 22 OFF, and thus the supply of charge to the output node PREOUT from the PMOS transistor 22 can be stopped. Hence, the NMOS transistors 14 and 16 can draw the charge from the output node PREOUT at high speed (that is, the output node PREOUT can be discharged to become "L" at high speed).

Next, the case that the signal SIG0 shifts from "H" to "L" will be described. When the clocks CLK1 and CLK2 go "H" while the signal SIG0 is "H", both the NMOS transistors 14 and 16 are ON, allowing the output node PREOUT to start discharge as described above, and thus the potential of this node starts decreasing.

Thereafter, when the signal SIG0 goes "L", the NMOS transistor 14 is turned OFF, stopping the discharge from the output node PREOUT. Since charge is being supplied to the output node PREOUT from the PMOS transistors 22 and 34, the potential of this node resumes "H". The output signal WL from the inverter 32 remains "L".

The feedback signal FB then goes "H", turning the PMOS transistor 22 from ON to OFF, but the potential of the output node PREOUT is kept "H". The potential of the output node PREOUT remains unchanged even though the clocks CLK1 and CLK2 go "L" and then the signal SIG0 goes "H".

As described above, both the NMOS transistors 14 and 16 are ON temporarily, permitting discharge of the output node PREOUT. During this time, however, the PMOS transistor 22 is supplying charge to the output node PREOUT. Therefore, occurrence of a glitch in the output signal WL from the inverter 32 due to a great decrease in the potential of the output node PREOUT is suppressed, and thus occurrence of a malfunction can be prevented.

The semiconductor integrated circuit 40 is configured so that the clock CLK1 goes "H" turning the PMOS transistor 12 OFF before the clock CLK2 goes "H" turning the NMOS transistor 16 ON.

By configuring as described above, when the signal SIG0 is "H", no charge will be supplied from the PMOS transistor 12 at the time when the NMOS transistor 16 is turned ON to draw charge from the output node PREOUT. Thus, the NMOS transistors 14 and 16 can draw charge at high speed.

Figure 3:
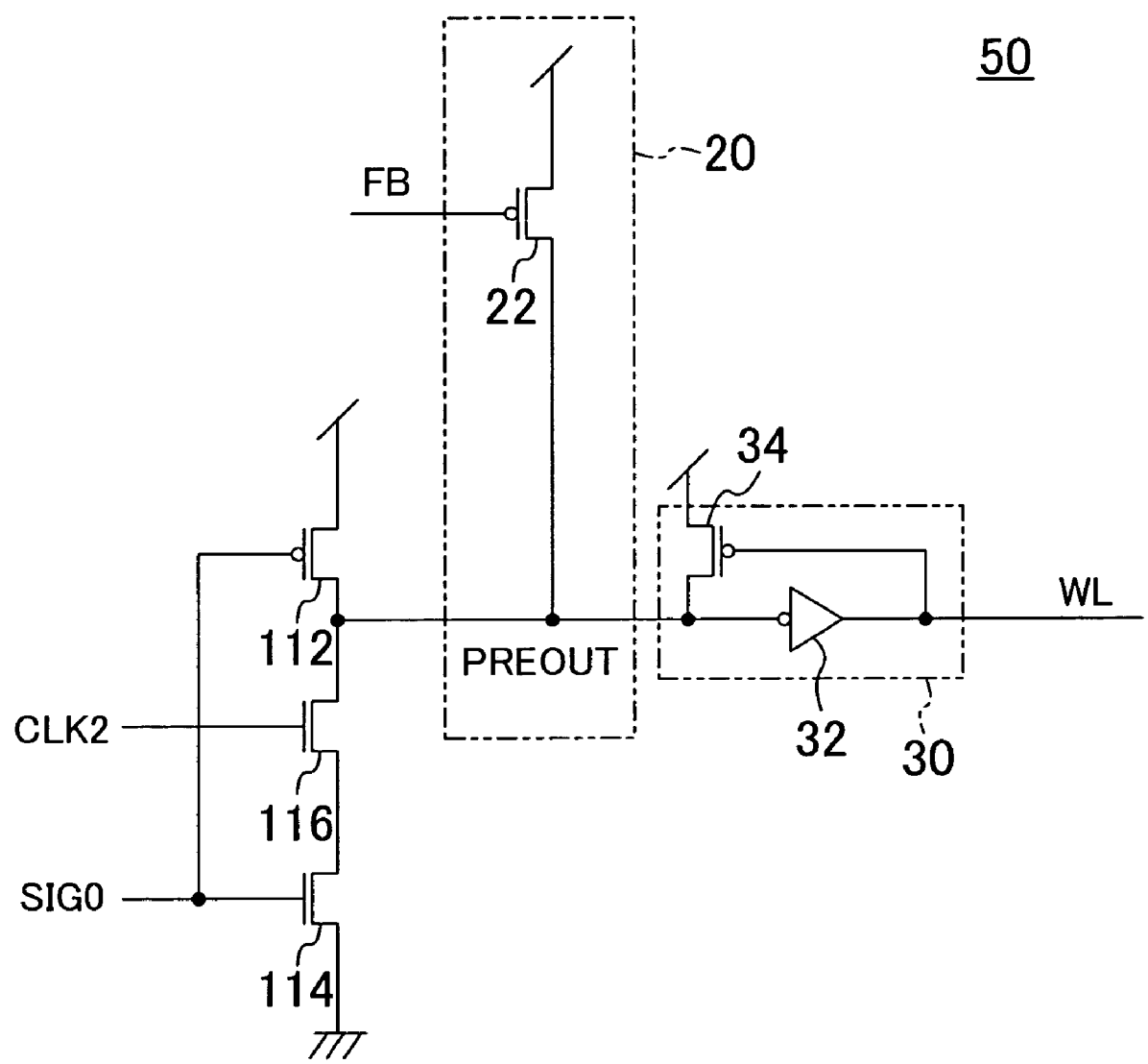
FIG. 3 is a circuit diagram of an alteration to the semiconductor integrated circuit of FIG. 1.

FIG. 3 is a circuit diagram of an alteration to the semiconductor integrated circuit of FIG. 1. The semiconductor integrated circuit of FIG. 3, denoted by 50, includes a PMOS transistor 112 and NMOS transistors 114 and 116, in place of the PMOS transistor 12 and the NMOS transistors 14 and 16 in the semiconductor integrated circuit 40 of FIG. 1.

The signal SIG0 is input into the PMOS transistor 112 and the NMOS transistor 114. The clock CLK2 is input into the NMOS transistor 116. That is, the PMOS transistor 112 receives the signal SIG0, not the clock CLK1.

The operation of the semiconductor integrated circuit 50 will be described with reference to FIG. 2. In the case that the signal SIG0 is "H", the PMOS transistor 112 is OFF while the NMOS transistor 114 is ON. When the clock CLK2 goes "H", both the NMOS transistors 114 and 116 are ON. The feedback signal FB then goes "H" turning the PMOS transistor 22 OFF, and this stops supply of charge to the output node PREOUT from the PMOS transistor 22. Hence, in the semiconductor integrated circuit 50, as in the semiconductor integrated circuit 40 of FIG. 1, the charge at the output node PREOUT can be drawn at high speed.

The case that the signal SIG0 shifts from "H" to "L" is as follows. The feedback signal FB remains "L" keeping the PMOS transistor 22 ON. When the clock CLK2 goes "H", both the NMOS transistors 114 and 116 are ON, allowing the output node PREOUT to start discharge. After this start of discharge, the signal SIG0 goes "L". With this, the NMOS transistor 114 is turned OFF, and also the PMOS transistor 112 is turned ON to start supply of charge to the output node PREOUT. The feedback signal FB then goes "H" turning the PMOS transistor 22 from ON to OFF.

As described above, both the NMOS transistors 114 and 116 are ON temporarily, allowing discharge from the output node PREOUT. During this time, however, the PMOS transistor 22 is supplying charge to the output node PREOUT. Therefore, in the semiconductor integrated circuit 50, as in the semiconductor integrated circuit 40 of FIG. 1, the potential of the output node PREOUT is prevented from greatly decreasing. Thus, occurrence of a glitch is suppressed and thus occurrence of a malfunction can be prevented.

Note that in the semiconductor integrated circuit 40 of FIG. 1, the NMOS transistor 14 and the NMOS transistor 16 may be interchanged, and in the semiconductor integrated circuit 50 of FIG. 3, the NMOS transistor 114 and the NMOS transistor 116 may be interchanged.

Figure 4:
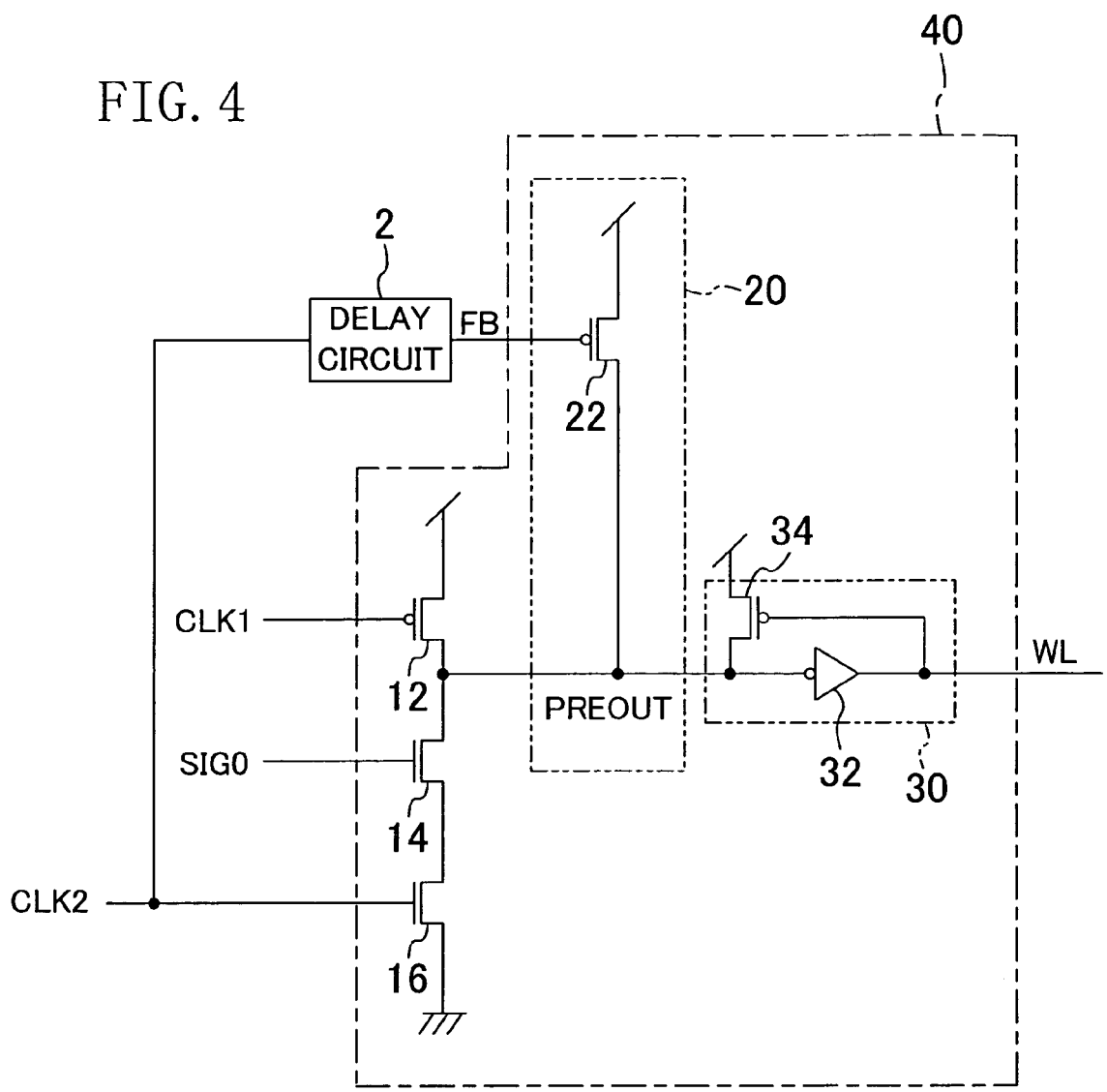
FIG. 4 is a circuit diagram of another alteration to the semiconductor integrated circuit of FIG. 1.

FIG. 4 is a circuit diagram of another alteration to the semiconductor integrated circuit of FIG. 1. The semiconductor integrated circuit of FIG. 4 includes a delay circuit 2 in addition to the components of the semiconductor integrated circuit 40 of FIG. 1. The delay circuit 2 delays the clock CLK2 and outputs the delayed signal to the gate of the PMOS transistor 22 as the feedback signal FB.

Figure 5:
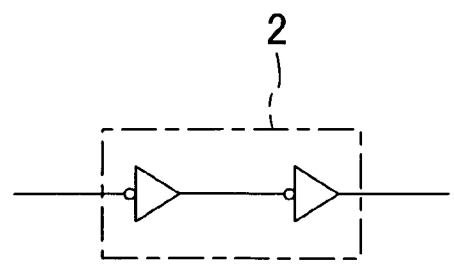
FIG. 5 is a circuit diagram of an example of a delay circuit in FIG. 4.

FIG. 5 is a circuit diagram of an example of the delay circuit 2 in FIG. 4. The delay circuit 2 includes two serially-connected inverters, and thus outputs the input signal without inverting the signal. Alternatively, four or more even-numbered inverters connected in series may be used, or elements other than inverters may be used as long as they can delay the signal.

Figure 6:
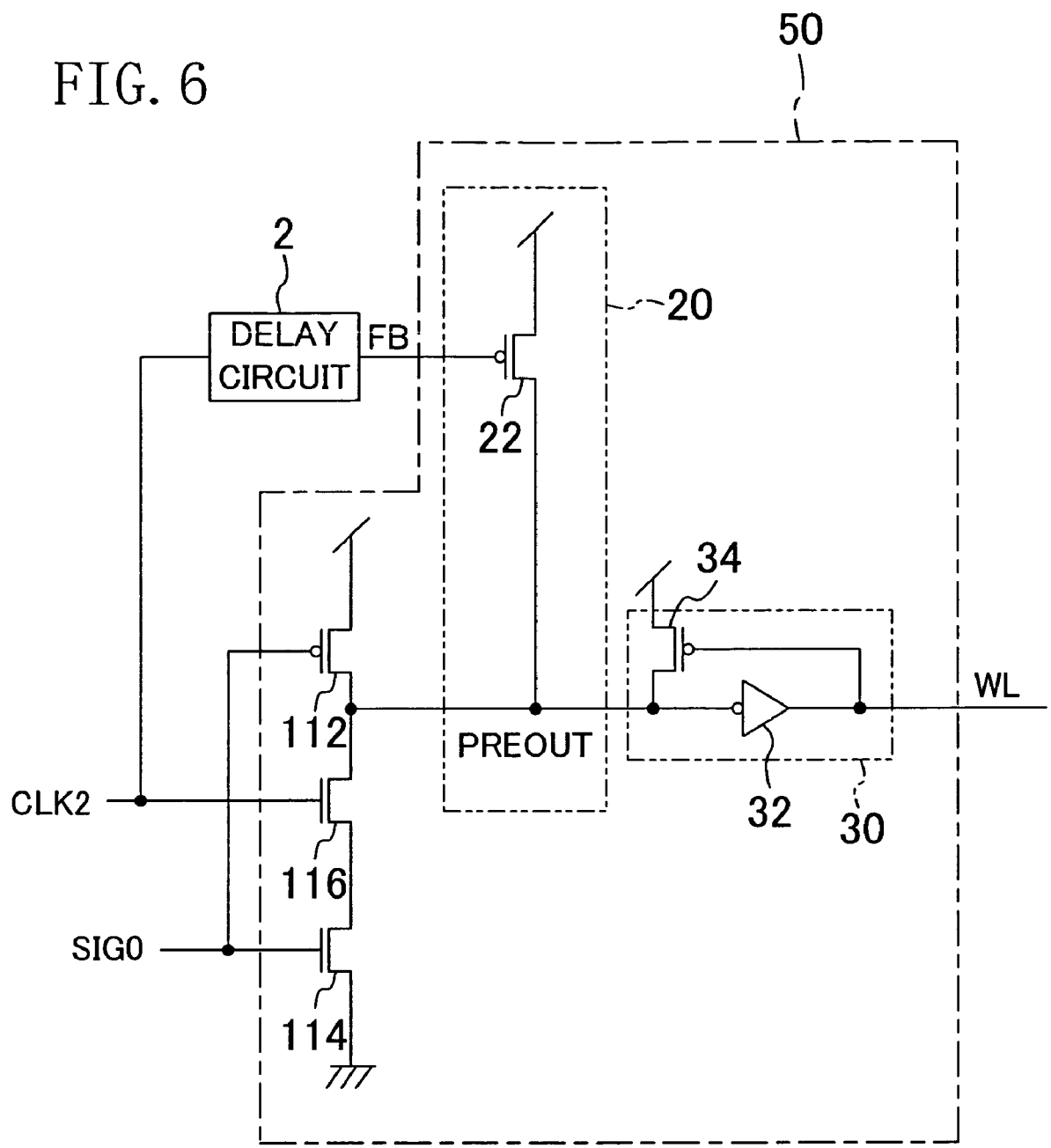
FIG. 6 is a circuit diagram of an alteration to the semiconductor integrated circuit of FIG. 3.

In the semiconductor integrated circuit of FIG. 4, in which the delay circuit 2 delays the clock CLK2 and outputs the resultant signal, the level of the feedback signal FB supplied to the gate of the PMOS transistor 22 shifts after the lapse of the delay time given by the delay circuit 2 from the shift of the level of the clock CLK2. Therefore, since the relationship between the clock CLK2 and the feedback FB is as shown in FIG. 2, the semiconductor integrated circuit of FIG. 4 operates in substantially the same manner as the semiconductor integrated circuit 40 of FIG. 1. FIG. 6 is a circuit diagram of an alteration to the semiconductor integrated circuit of FIG. 3. The semiconductor integrated circuit of FIG. 6 includes a delay circuit 2 in addition to the components of the semiconductor integrated circuit 50 of FIG. 3. The delay circuit 2, which is configured as shown in FIG. 5, for example, delays the clock CLK2 and outputs the delayed signal to the gate of the PMOS transistor 22 as the feedback signal FB. The delay circuit 2 thus outputs the clock CLK2 without inverting the signal.

In the semiconductor integrated circuit of FIG. 6, also, the delay circuit 2 delays the clock CLK2 and outputs the resultant signal. Therefore, the level of the feedback signal FB supplied to the gate of the PMOS transistor 22 shifts after the lapse of the delay time given by the delay circuit 2 from the shift of the level of the clock CLK2. Thus, since the relationship between the clock CLK2 and the feedback FB is as shown in FIG. 2, the semiconductor integrated circuit of FIG. 6 operates in substantially the same manner as the semiconductor integrated circuit 50 of FIG. 3.

Figure 7:
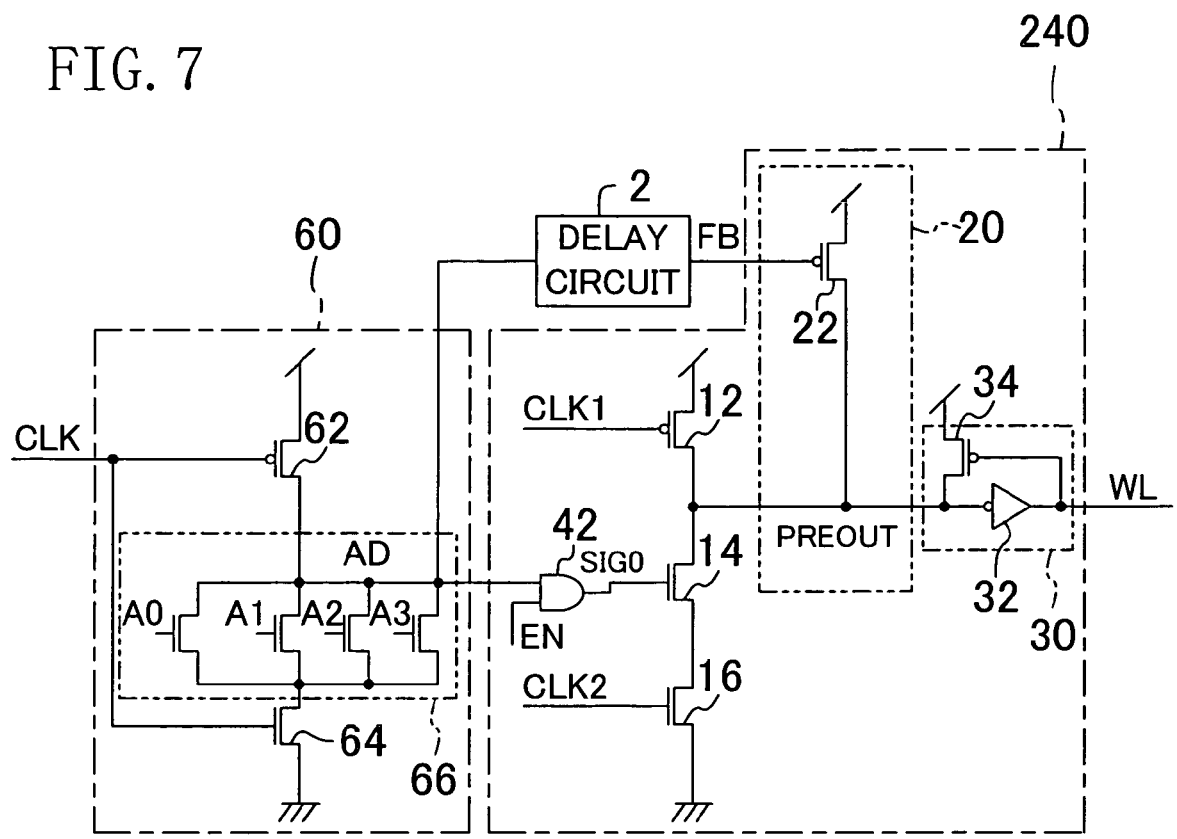
FIG. 7 is a circuit diagram of a semiconductor integrated circuit having a decode circuit.

FIG. 7 is a circuit diagram of a semiconductor integrated circuit having a decode circuit. The semiconductor integrated circuit of FIG. 7 includes a decode circuit 60, an output circuit 240 and a delay circuit 2. The decode circuit 60 includes a PMOS transistor 62, an NMOS transistor 64, and a parallel circuit 66 composed of four NMOS transistors connected in parallel, to thus constitute a dynamic NOR circuit. The output circuit 240 is substantially the same as the semiconductor integrated circuit 40 of FIG. 1 except that an AND gate 42 is additionally provided. The output circuit 240 may not necessarily include the AND gate 42.

The PMOS transistor 62 and the NMOS transistor 64 are turned ON and OFF repeatedly according to the level of a clock CLK that is synchronous with the clock CLK1. Bits A0, A1, A2 and A3 of an address have been respectively input in the four transistors of the parallel circuit 66. The decode circuit 60 determines whether or not the input address matches with the value "0000" that corresponds to this decode circuit 60.

If the input address matches with the value "0000", that is, if all of the bits A0 to A3 of the address are "L", all of the transistors of the parallel circuit 66 are OFF. Therefore, the drain potential of these transistors (potential of a decode output node AD) remains "H". In the other cases, the parallel circuit 66 will be conducted, allowing the potential of the node AD to become "L". That is, the potential of the node AD indicates the determination result.

The semiconductor integrated circuit of FIG. 7 is used as a driver circuit for driving a word line, in which the output signal WL from the inverter 32 can be used as a signal for driving a word line corresponding to the address "0000".

The AND gate 42 outputs the signal SIG0 of "H" level to the NMOS transistor 14 if an enable signal EN is "H" and the node AD is "H", and otherwise outputs the signal SIG0 of "L" level. The delay circuit 2 provides a predetermined delay for the potential of the node AD and outputs the delayed signal to the PMOS transistor 22.

The circuit of FIG. 7 configured as described above operates as follows if the enable signal EN is "H". If all of the bits A0 to A3 of the address are "L" (if the address hits), the signal SIG0 remains "H". Therefore, as described above with reference to FIG. 2, the output node PREOUT goes "L" and then the output signal WL from the inverter 32 goes "H". In the other cases (if the address misses), the signal SIG0 goes "L". Therefore, the output node PREOUT roughly remains "H" and then the output signal WL remains "L".

Figure 8:
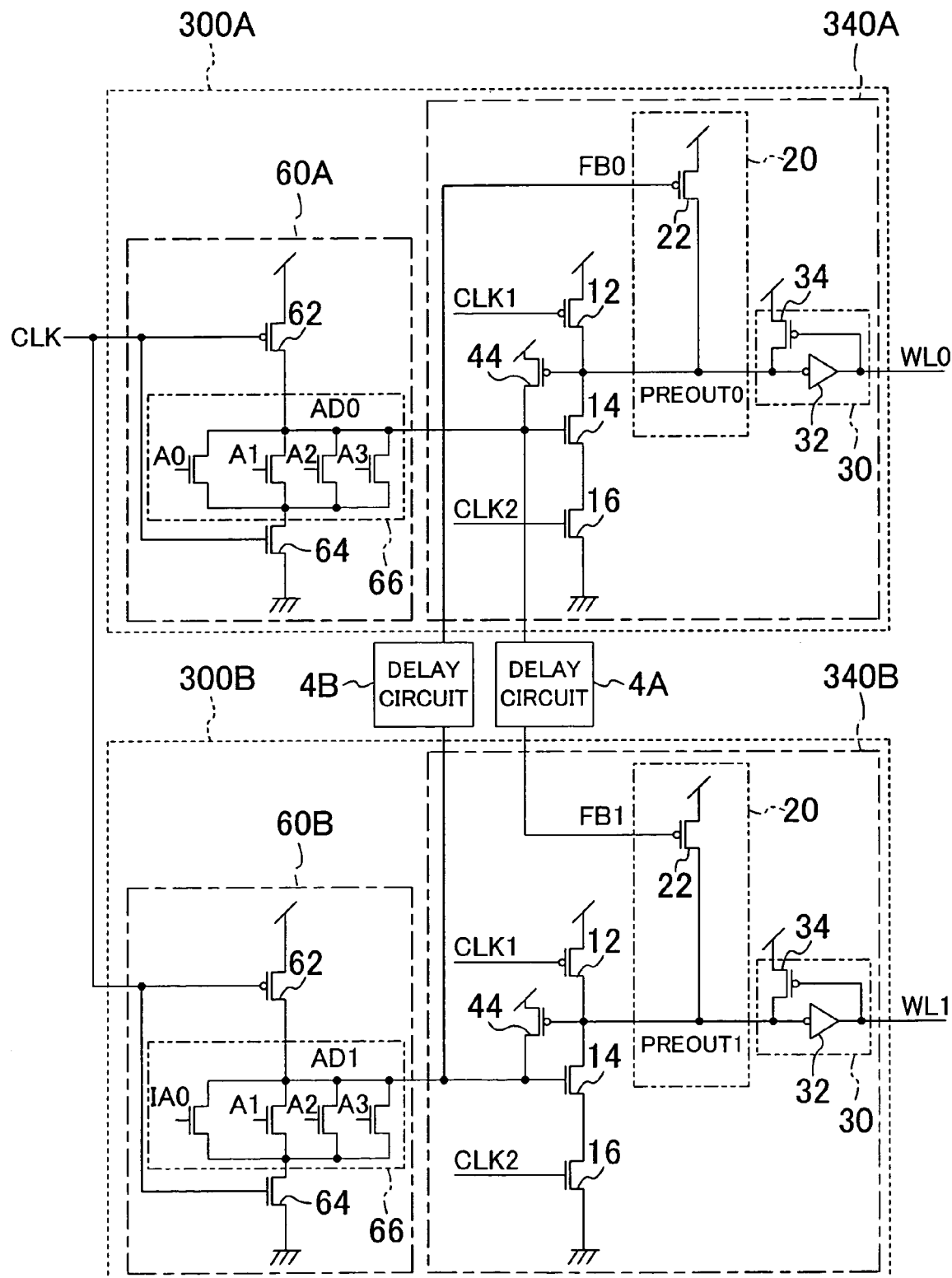
FIG. 8 is a circuit diagram of a semiconductor integrated circuit having two driver circuits.

FIG. 8 is a circuit diagram of a semiconductor integrated circuit having two driver circuits. The semiconductor integrated circuit of FIG. 8 includes driver circuits 300A and 300B and delay circuits 4A and 4B. The driver circuit 300A includes a decode circuit 60A and an output circuit 340A. The driver circuit 300B includes a decode circuit 60B and an output circuit 340B.

The decode circuits 60A and 60B are the same in configuration as the decode circuit 60 in FIG. 7, except that bits IA0, A1, A2 and A3 of the address have been input in the parallel circuit 66 of the decode circuit 60B. The bit IA0 is a signal logically inverted from the bit A0. The output circuits 340A and 340B are substantially the same as the semiconductor integrated circuit 40 of FIG. 1, except that a PMOS transistor 44 is additionally provided. The output circuits 340A and 340B may not necessarily include the PMOS transistor 44.

Figure 9:
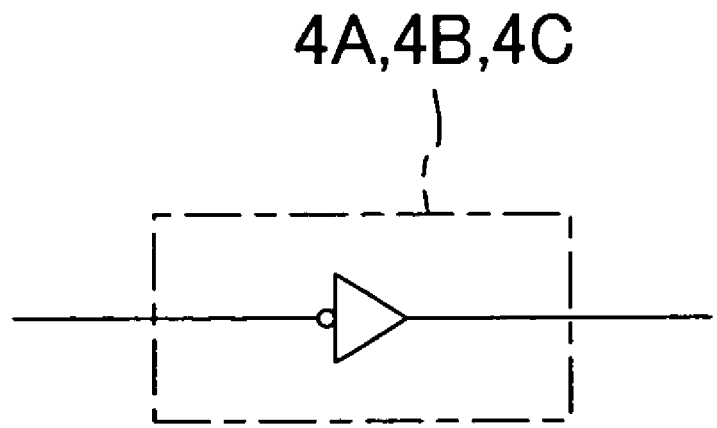
FIG. 9 is a circuit diagram of an example of a delay circuit in FIG. 8.

FIG. 9 is a circuit diagram of an example of the delay circuits 4A and 4B. As shown in FIG. 9, the delay circuits 4A and 4B, each composed of one inverter, invert the input signal and output the inverted signal. Alternatively, three or more odd-numbered inverters connected in series may be used, or elements other than inverters may be used as long as they can delay the signal.

A decode output node AD0 of the decode circuit 60A is connected to the gate of the NMOS transistor 14 of the output circuit 340A and to the delay circuit 4A. The delay circuit 4A logically inverts the potential of the node AD0 and outputs a resultant feedback signal FB1 to the gate of the PMOS transistor 22 of the output circuit 340B.

A decode output node AD1 of the decode circuit 60B is connected to the gate of the NMOS transistor 14 of the output circuit 340B and to the delay circuit 4B. The delay circuit 4B logically inverts the potential of the node AD1 and outputs a resultant feedback signal FB0 to the gate of the PMOS transistor 22 of the output circuit 340A.

Figure 10:
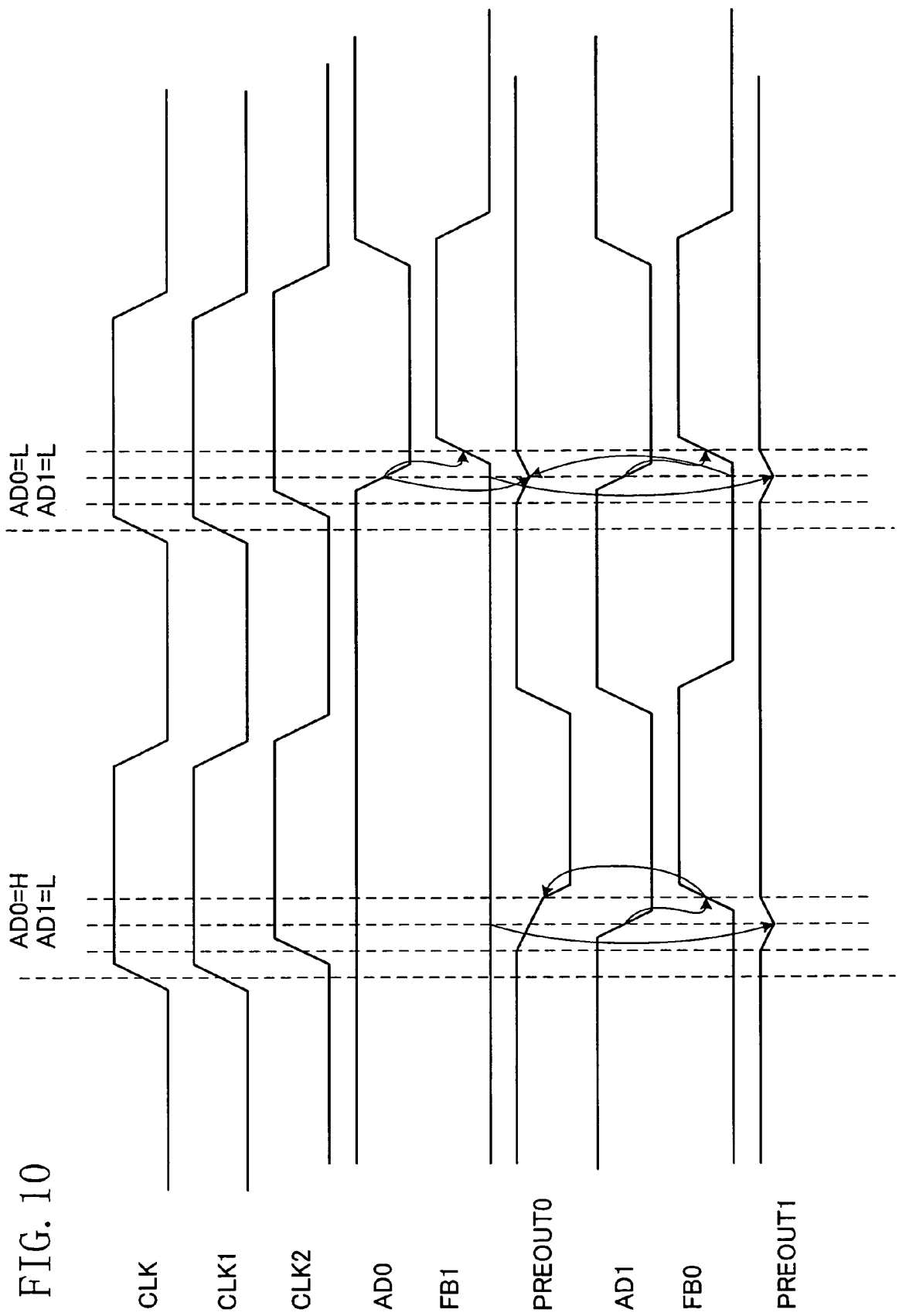
FIG. 10 is a timing chart of signals in the semiconductor integrated circuit of FIG. 8.

FIG. 10 is a timing chart of the signals in the semiconductor integrated circuit of FIG. 8. Referring to FIG 10, the operation of the semiconductor integrated circuit of FIG. 8 will be described.

(1) Case that the address hits in the driver circuit 300A while the address misses in the driver circuit 300B (when A0=A1=A2=A3="L" is satisfied)

In the driver circuit 300A, the potential of the node AD0 is kept "H". Therefore, when the clock CLK2 goes "H" turning the NMOS transistor 16 ON, the potential of an output node PREOUT0 shifts from "H" to "L". The feedback signal FB1 output from the delay circuit 4A is "L", and thus the PMOS transistor 22 of the driver circuit 300B is ON.

In the driver circuit 300B, the potential of the node AD1 shifts from "H" to "L" after the NMOS transistor 16 is turned ON, and thus the potential of an output node PREOUT1 decreases. At this time, since the PMOS transistors 22 and 34 are ON, charge is supplied from these transistors to the output node PREOUT1, suppressing occurrence of a glitch. An output signal WL1 is "L" at this time.

When the node AD1 becomes "L", the feedback signal FB0 output from the delay circuit 4B shifts from "L" to "H" after the lapse of a predetermined delay time, and this turns the PMOS transistor 22 of the driver circuit 300A OFF. Therefore, since it is only the PMOS transistor 34 that still supplies charge to the output node PREOUT0, the charge at the output node PREOUT0 is drawn at high speed. Once the output node PREOUT0 becomes "L", the PMOS transistor 44 is turned ON, and this keeps the potential of the node AD0 "H". An output signal WL0 is "H" at this time.

In short, if the address hits as in the driver circuit 300A, the PMOS transistor 22 of this circuit shifts from ON to OFF stopping supply of charge to the output node PREOUT0. This enables high-speed drawing of charge from this node.

If the address misses as in the driver circuit 300B, the PMOS transistor 22 of this circuit is kept ON, and thus supplies charge to the output node PREOUT1 together with the PMOS transistor 34. Occurrence of a glitch can therefore be suppressed.

Note that substantially the same description applies for the case that the address hits in the driver circuit 300B while the address misses in the driver circuit 300A.

(2) Case that the address misses in both the driver circuits 300A and 300B (when A1=A2=A3="L" is not satisfied)

In the driver circuit 300A, the node AD0 shifts from "H" to "L" after the clock CLK2 goes "H" turning the NMOS transistor 16 ON, and thus the potential of the output node PREOUT0 decreases. When the node AD0 becomes "L", the feedback signal FB1 output from the delay circuit 4A shifts from "L" to "H" after the lapse of a predetermined delay time, and this turns the PMOS transistor 22 of the driver circuit 300B OFF.

In the driver circuit 300B, the node AD1 shifts from "H" to "L" after the clock CLK2 goes "H" turning the NMOS transistor 16 ON, and thus the potential of the output node PREOUT1 decreases. When the node AD1 becomes "L", the feedback signal FB0 output from the delay circuit 4B shifts from "L" to "H" after the lapse of a predetermined delay time, and this turns the PMOS transistor 22 of the driver circuit 300A OFF.

The feedback signal FB0 is not yet "H" during the predetermined delay time given by the delay circuit 4B after the node AD1 goes "L", and thus the PMOS transistor 22 of the driver circuit 300A is not yet turned OFF. That is, the PMOS transistor 22 keeps supplying charge to the output node PREOUT0, and thus occurrence of a glitch at the output node PREOUT0 is suppressed. The output signal WL0 remains "L".

Likewise, the feedback signal FB1 is not yet "H" for the predetermined delay time given by the delay circuit 4A after the node AD0 goes "L", and thus the PMOS transistor 22 of the driver circuit 300B is not yet turned OFF. That is, the PMOS transistor 22 keeps supplying charge to the output node PREOUT1, and thus occurrence of a glitch at the output node PREOUT1 is suppressed. The output signal WL1 remains "L".

Thus, even when the address misses in both the driver circuits 300A and 300B, occurrence of a glitch at the output nodes PREOUT0 and PREOUT1 can be suppressed.

As described above, the decode circuits 60A and 60B are circuits dedicated to adjacent addresses different in only one bit for determining whether or not the corresponding address hits. The determination result in one decode circuit is given to the feedback circuit 20 in the driver circuit to which the other decode circuit belongs.

By configuring as described above, interconnection resources between driver circuits can be minimized, and this facilitates the layout. Also, if the address misses in both the driver circuits 300A and 300B, the difference in the number of On-state transistors among the NMOS transistors constituting the parallel circuit between the driver circuits 300A and 300B will be the minimum. This facilitates control of the delay time of the signal supplied to the feedback circuit 20.

Figure 11:
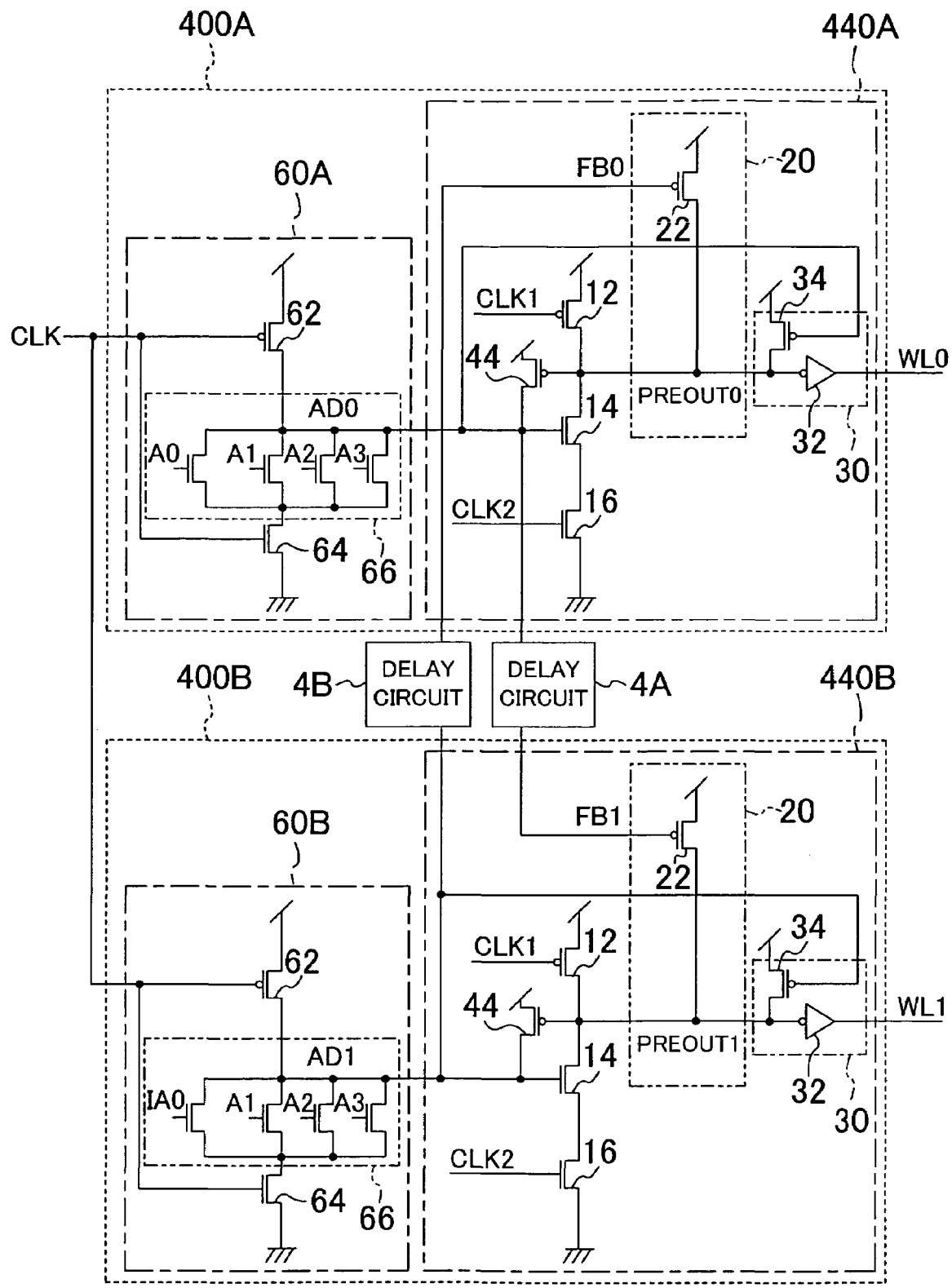
FIG. 11 is a circuit diagram of an alteration to the semiconductor integrated circuit of FIG. 8.

FIG. 11 is a circuit diagram of an alteration to the semiconductor integrated circuit of FIG. 8. The semiconductor integrated circuit of FIG. 11 includes driver circuits 400A and 400B and the delay circuits 4A and 4B. The driver circuit 400A includes the decode circuit 60A and an output circuit 440A. The driver circuit 400B includes the decode circuit 60B and an output circuit 440B.

The decode circuits 60A and 60B are the same as those described with reference to FIG. 8. The output circuit 440A is the same as the output circuit 340A in FIG. 8 except that the gate of the PMOS transistor 34 is connected to the decode output node AD0. The output circuit 440B is the same as the output circuit 340B in FIG. 8 except that the gate of the PMOS transistor 34 is connected to the decode output node AD1.

The PMOS transistor 34 of the output circuit 440A is ON when the node AD0 is "L". This can therefore serve to suppress occurrence of a glitch on the occasion that the potential of the output node PREOUT0 should be kept "H". Also, this transistor is not ON when the node AD0 is "H". This can therefore serve to draw the charge from the output node PREOUT0 at a higher speed than in the circuit of FIG. 8 on the occasion that the potential of the output node PREOUT0 should go "L". The above also applies for the output circuit 440B.

Figure 12:
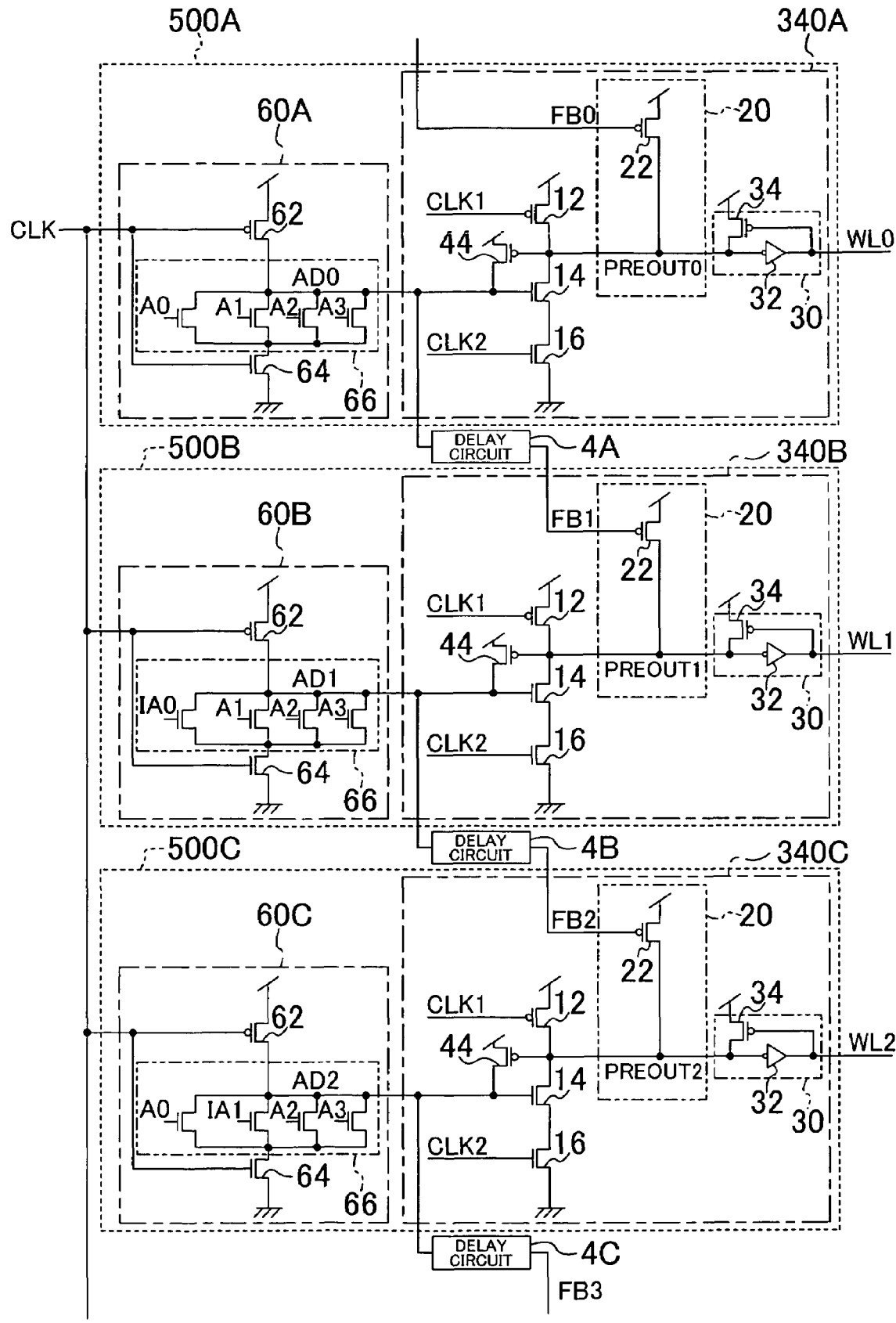
FIG. 12 is a circuit diagram of a semiconductor integrated circuit having three driver circuits.

FIG. 12 is a circuit diagram of a semiconductor integrated circuit having three driver circuits. The semiconductor integrated circuit of FIG. 12 includes driver circuits 500A, 500B and 500C and delay circuits 4A, 4B and 4C. The driver circuit 500A includes the decode circuit 60A and the output circuit 340A. The driver circuit 500B includes the decode circuit 60B and the output circuit 340B. The driver circuit 500C includes a decode circuit 60C and an output circuit 340C.

The decode circuits 60A and 60B and the output circuits 340A and 340B are the same as those described with reference to FIG. 8. The delay circuits 4A and 4B are the same as those described with reference to FIG. 9. The output circuit 340C and the decode circuit 60C are the same in configuration as the output circuit 340A and the decode circuit 60A, respectively. Note however that bits A0, IA1, A2 and A3 of the address are have been input in the parallel circuit 66 of the decode circuit 60C. The bit IA1 is a signal logically inverted from the bit A1. The delay circuit 4C is the same in configuration as the delay circuit 4A.

The delay circuit 4A logically inverts the potential of the decode output node AD0 and outputs the resultant feedback signal FB1 to the gate of the PMOS transistor 22 of the output circuit 340B. The delay circuit 4B logically inverts the potential of the decode output node AD1 and outputs a resultant feedback signal FB2 to the gate of the PMOS transistor 22 of the output circuit 340C. The delay circuit 4C logically inverts the potential of a decode output node AD2 and outputs a resultant feedback signal FB3. The other features of the semiconductor integrated circuit of FIG. 12 are roughly the same as those of the semiconductor integrated circuit of FIG. 8.

More circuits may be connected in the same manner. That is, roughly the same circuits as the output circuit 340C and the decode circuit 60C may further be provided, and the feedback signal FB3 may be supplied to the gate of the PMOS transistor 22 of the new output circuit. Also, roughly the same circuits as the output circuit 340A, the decode circuit 60A and the delay circuit 4A may further be provided, and the potential of the decode output node of the new decode circuit may be supplied to the gate of the PMOS transistor 22 of the output circuit 340A as the feedback signal FB0 via the new delay circuit.

(3) Case that the address hits in the driver circuit 500B while the address misses in the driver circuits 500A and 500C (when IA0=A1=A2=A3="L" is satisfied)

In the driver circuit 500B, the potential of the node AD1 is kept "H". Therefore, when the clock CLK2 goes "H" turning the NMOS transistor 16 ON, the potential of the output node PREOUT1 shifts from "H" to "L". Since the feedback signal FB2 output from the delay circuit 4B is "L", the PMOS transistor 22 of the driver circuit 500C is ON.

In the driver circuit 500C, the node AD2 shifts from "H" to "L" after the NMOS transistor 16 is turned ON, and this decreases the potential of an output node PREOUT2. At this time, since the PMOS transistors 22 and 34 are ON, charge is supplied from these transistors to the output node PREOUT2, suppressing occurrence of a glitch. An output signal WL2 is "L" at this time.

In the driver circuit 500A, also, the node AD0 shifts from "H" to "L". When the node AD0 becomes "L", the feedback signal FB1 supplied from the delay circuit 4A shifts from "L" to "H" after the lapse of a predetermined delay time, and this turns the PMOS transistor 22 of the driver circuit 500B OFF. Therefore, since it is only the PMOS transistor 34 that still supplies charge to the output node PREOUT1, the charge at the output node PREOUT1 is drawn at high speed. Once the output node PREOUT1 becomes "L", the PMOS transistor 44 is turned ON, and this keeps the potential of the node AD1 "H". The output signal WL1 is "H" at this time.

In short, when the address hits as in the driver circuit 500B, the PMOS transistor 22 of this circuit shifts from ON to OFF stopping supply of charge to the output node PREOUT1. This enables high-speed drawing of charge from this node.

When the address misses as in the driver circuit 500C, the PMOS transistor 22 of this circuit is kept ON, and thus supplies charge to the output node PREOUT2 together with the PMOS transistor 34. Occurrence of a glitch can therefore be suppressed.

Note that substantially the same description applies for the case that the address hits in the driver circuit 500A while the address misses in the driver circuits 500B and 500C and the case that the address hits in the driver circuit 500C while the address misses in the driver circuits 500A and 500B.

(4) When the address misses in the driver circuits 500A, 500B and 500C

In the driver circuit 500A, the node AD0 shifts from "H" to "L" after the clock CLK2 becomes "H" turning the NMOS transistor 16 ON, and thus the potential of the output node PREOUT0 decreases. When the node AD0 becomes "L", the feedback signal FB1 output from the delay circuit 4A shifts from "L" to "H" after the lapse of a predetermined delay time, and thus the PMOS transistor 22 of the driver circuit 500B is turned OFF.

In the driver circuit 500B, also, the node AD1 shifts from "H" to "L" after the clock CLK2 becomes "H" turning the NMOS transistor 16 ON, and thus the potential of the output node PREOUT1 decreases. When the node AD1 becomes "L", the feedback signal FB2 output from the delay circuit 4B shifts from "L" to "H" after the lapse of a predetermined delay time, and thus the PMOS transistor 22 of the driver circuit 500C is turned OFF. This also applies for the driver circuit 500C.

The feedback signal FB1 is not yet "H" during the predetermined delay time given by the delay circuit 4A after the node AD0 becomes "L", and thus the PMOS transistor 22 of the driver circuit 500B is not yet turned OFF. In other words, the PMOS transistor 22 keeps supplying charge to the output node PREOUT1, suppressing occurrence of a glitch at the output node PREOUT1. The output signal WL1 remains "L".

Also, the feedback signal FB2 is not yet "H" during the predetermined delay time given by the delay circuit 4B after the node AD1 becomes "L", and thus the PMOS transistor 22 of the driver circuit 500C is not yet turned OFF. In other words, the PMOS transistor 22 keeps supplying charge to the output node PREOUT2, suppressing occurrence of a glitch at the output node PREOUT2. The output signal WL2 remains "L".

As described above, even when the address misses in all the driver circuits 500A, 500B and 500C, occurrence of a glitch at the output nodes PREOUT1 and PREOUT2 can be suppressed.

Thus, the decode circuits 60A, 60B and 60C are circuits dedicated to adjacent addresses sequentially different by one for determining whether or not the corresponding address hits. The determination result in each circuit is given to the feedback circuit 20 in the adjacent driver circuit.

By configuring as described above, interconnection resources between driver circuits can be minimized, and this facilitates the layout.

Figure 13:
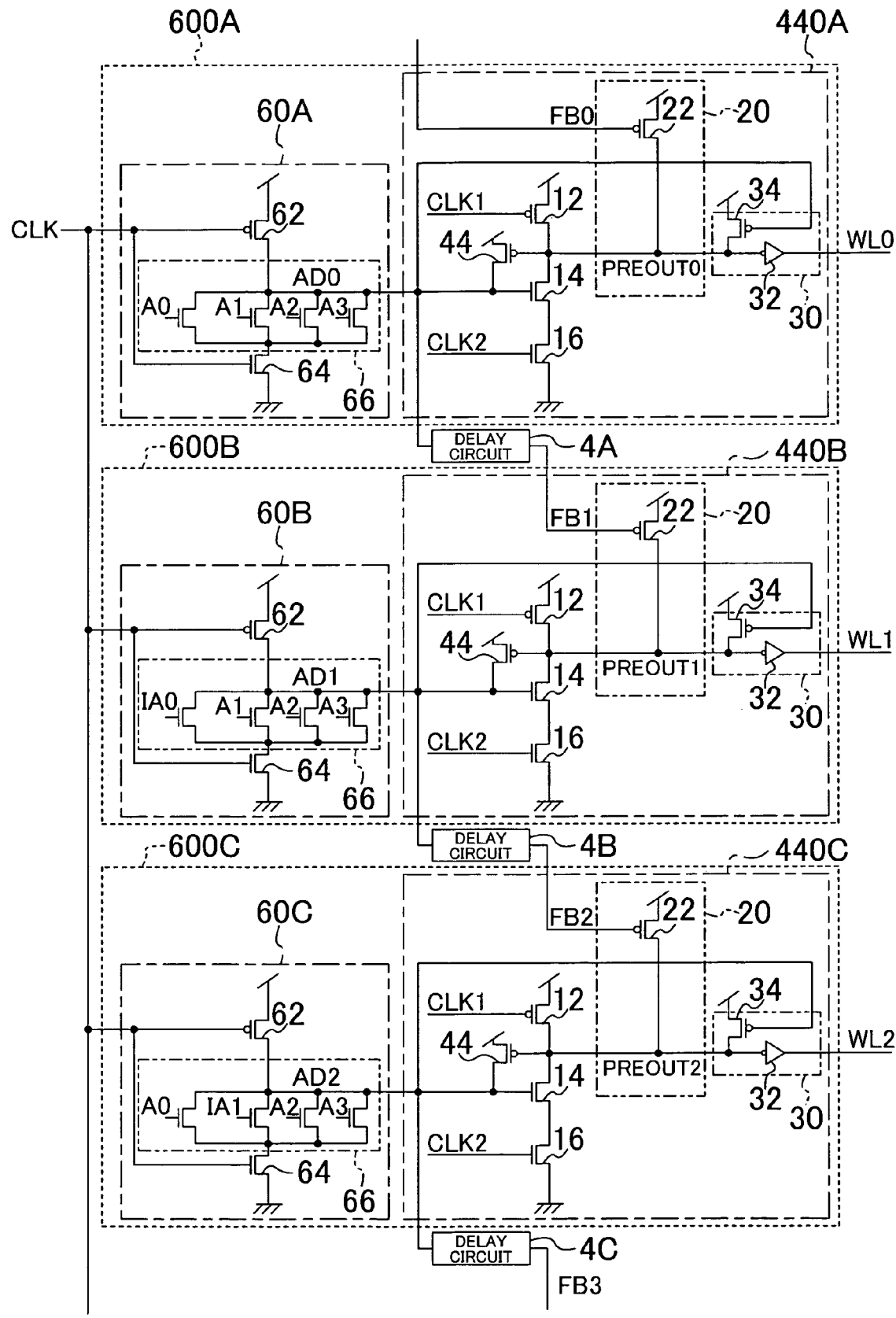
FIG. 13 is a circuit diagram of an alteration to the semiconductor integrated circuit of FIG. 12.

FIG. 13 is a circuit diagram of an alteration to the semiconductor integrated circuit of FIG. 12. The semiconductor integrated circuit of FIG. 13 includes driver circuits 600A, 600B and 600C and the delay circuits 4A, 4B and 4C. The driver circuit 600A includes the decode circuit 60A and the output circuit 440A. The driver circuit 600B includes the decode circuit 60B and the output circuit 440B. The driver circuit 600C includes the decode circuit 60C and the output circuit 440C.

The decode circuits 60A, 60B and 60C and the outputs circuits 440A and 440B are the same as those described with reference to FIGS. 8, 11 and 12. The output circuit 440C is the same as the output circuit 340C in FIG. 12 except that the gate of the PMOS transistor 34 is connected to the decode output node AD2.

The PMOS transistor 34 of the output circuit 440A is ON when the node AD0 is "L". This can therefore serve to suppress occurrence of a glitch on the occasion that the potential of the output node PREOUT0 should be kept "H". Also, this transistor is not ON when the node AD0 is "H". This can therefore serve to draw the charge from the output node PREOUT0 at a higher speed than in the circuit of FIG. 12 on the occasion that the potential of the output node PREOUT0 should go "L". The above also applies for the output circuits 440B and 440C.

As described above, in the semiconductor integrated circuit of the present invention, if the address misses, occurrence of a glitch at the output node is suppressed and thus occurrence of a malfunction can be prevented. If the address hits, the charge at the output node can be drawn at high speed. In other words, the charge can be sufficiently drawn even when the circuit is operated with low voltage, and thus the range of the power supply voltage with which the circuit is operable can be widened.

The configuration may be made so that it takes shorter time to shift the potential from "H" to "L" in the node AD than in the output node PREOUT. Likewise, the configuration may be made so that it takes shorter time to shift the potential from "H" to "L" in the node AD0 than in the output node PREOUT0, in the node AD1 than in the output node PREOUT1, and in the node AD2 than in the output node PREOUT2.

By configuring as described above, if the address misses, the potential of the node AD, AD0, AD1, AD2 will become "L" swiftly, so that the potential of the output node PREOUT, PREOUT0, PREOUT1, PREOUT2 can be maintained.

In FIGS. 1, 4, 6, 7, 8 and 12, the sum of the gate widths of the PMOS transistors 22 and 34 is one-fifth or less of the sum of the gate widths of the NMOS transistors 14 and 16 in the same output circuit, for example.

With the above setting, if the power supply voltage is as low as about 0.6 V, for example, the discharge from the output node PREOUT or the like with the serially-connected NMOS transistors 14 and 16 is faster than the supply of charge to the output node PREOUT or the like from the PMOS transistors 22 and 34, and thus normal operation can be done.

Also, in FIGS. 1, 4, 6, 7, 8 and 12, the gate width of the PMOS transistor 22 is equal to or more than the gate width of the PMOS transistor 34 in the same output circuit, for example.

With the above setting, the charge supplied to the output node PREOUT or the like after the PMOS transistor 22 is turned OFF can be greatly reduced. Thus, the discharge from the output node PREOUT or the like with the NMOS transistors 14 and 16 can be sped up. This is especially effective when the power supply voltage is low.

In FIGS. 11 and 13, the gate width of the PMOS transistor 22 is one-fifth or less of the sum of the gate widths of the NMOS transistors 14 and 16 in the same output circuit, for example.

With the above setting, if the power supply voltage is as low as about 0.6 V, for example, the discharge from the output node PREOUT0 or the like with the serially-connected NMOS transistors 14 and 16 is faster than the supply of charge to the output node PREOUT0 or the like from the PMOS transistor 22, and thus normal operation can be done.

In FIGS. 1, 4, 6, 7, 8 and 12, the gate oxide thickness of the PMOS transistors 22 and 34 is larger than the gate oxide thickness of any of the NMOS transistors 14 and 16 in the same output circuit. In other words, the magnitude of the threshold voltage of the PMOS transistors 22 and 34 is greater than the magnitude of the threshold voltage of any of the NMOS transistors 14 and 16 in the same output circuit.

With the above setting, the current driving capability of the PMOS transistors 22 and 34 is smaller than that of any of the NMOS transistors 14 and 16. That is, during the discharge from the output node PREOUT or the like, supply of charge to this output node can be reduced. This makes it possible to achieve speedup and also perform operation with low power supply voltage.

In FIGS. 1, 4, 6, 7, 8 and 12, the gate oxide thickness of the PMOS transistor 22 is smaller than the gate oxide thickness of the PMOS transistor 34 in the same output circuit.

In other words, the magnitude of the threshold voltage of the PMOS transistor 22 is smaller than the magnitude of the threshold voltage of the PMOS transistor 34. With the above setting, the current driving capability of the PMOS transistor 22 is greater than that of the PMOS transistor 34. Therefore, since the charge supplied to the output node PREOUT or the like can be greatly reduced after the PMOS transistor 22 is turned OFF, the discharge from the output node PREOUT or the like with the NMOS transistors 14 and 16 can be sped up.

In FIGS. 11 and 13, the gate oxide thickness of the PMOS transistor 22 is larger than the gate oxide thickness of any of the NMOS transistors 14 and 16 in the same output circuit. In other words, the magnitude of the threshold voltage of the PMOS transistor 22 is greater than the magnitude of the threshold voltage of any of the NMOS transistors 14 and 16.

With the above setting, the current driving capability of the PMOS transistor 22 is smaller than that of any of the NMOS transistors 14 and 16. That is, during the discharge from the output node PREOUT or the like, supply of charge to this output node can be suppressed. This makes it possible to achieve speedup and also perform operation with low power supply voltage.

In any of the above embodiments, the conductivity types of all the transistors and the logics of the signals may be inverted. That is, in the circuit diagrams described above, all the PMOS transistors may be changed to NMOS transistors, all the NMOS transistors may be changed to PMOS transistors, the power supply potential and the ground potential may be interchanged, and the logic levels of all the signals may be inverted.

As described above, according to the present invention, occurrence of a malfunction can be prevented by suppressing occurrence of a glitch, and also the change in the potential of the output node can be sped up. The present invention is therefore useful for dynamic circuits and the like.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor integrated circuit comprising:
a first transistor of a first conductivity type connected between a first power supply and an output node, the first transistor being turned ON according to a first clock to put the output node to a first logic level;
a second transistor of a second conductivity type, connected in a series to the first transistor, the second transistor being turned ON according to an input signal;
a third transistor of the second conductivity type connected in series to the second transistor, the third transistor being turned ON according to a second clock;
a fourth transistor of the first conductivity type connected between the first power supply and the output node, the fourth transistor being turned ON according to a feedback signal;
an inverter for outputting a signal inverted in logic level from the output node;
a fifth transistor of the first conductivity type connected between the first power supply and the output node, the fifth transistor being turned ON according to an output of the inverter;
a decode circuit for determining whether or not an input value matches with a predetermined value and outputting the determination result; and
a delay circuit for delaying the signal indicating the determination result from the decode circuit and outputting the delayed signal as the feedback signal,
wherein the second and third transistors are connected between the output node and a second power supply, and the fourth transistor is turned from ON to OFF after both the second and third transistors are turned ON, and
where the signal indicating the determination result from the decode circuit is used as the input signal.

2. The semiconductor integrated circuit of claim 1, wherein the fourth transistor is turned OFF after both the second and third transistors are first turned ON and then the second transistor is turned OFF.

3. The semiconductor integrated circuit of claim 1, wherein the first transistor is turned OFF before the third transistor is turned ON.

4. The semiconductor integrated circuit of claim 1, wherein the decode circuit comprises:
a sixth transistor of the first conductivity type connected between the first power supply and a decode output node at which the signal indicating the determination result is output, the sixth transistor is being turned ON according to a third clock synchronizing with the first clock to put the decode output node to the first logic level;
a seventh transistor of the second conductivity type, the seventh transistor being turned ON according to the third clock; and
a parallel circuit having a plurality of transistors of the second conductivity type connected in parallel, the parallel circuit being connected in series to the seventh transistor, the parallel circuit not being turned ON if the input value matches with the predetermined value and otherwise being turned ON, and
the seventh transistor and the parallel circuit are connected between the decode output node and the second power supply. the input signal as the first clock.

5. The semiconductor integrated circuit of claim 4, wherein it takes shorter time to shift the potential from the first logic level to a second logic level inverted from the first logic level in the decode output node than in the output node.

6. The semiconductor integrated circuit of claim 1, wherein the sum of the gate widths of the fourth and fifth transistors is one-fifth or less of the sum of the gate widths of the second and third transistors.

7. The semiconductor integrated circuit of claim 1, wherein the gate width of the fourth transistor is equal to or more than the gate width of the fifth transistor.

8. The semiconductor integrated circuit of claim 1, wherein the gate oxide thickness of the fourth and fifth transistors is larger than the gate oxide thickness of any of the second and third transistors.

9. The semiconductor integrated circuit of claim 1, wherein the gate oxide thickness of the fourth transistor is smaller than the gate oxide thickness of the fifth transistor.

10. The semiconductor integrated circuit of claim 1, wherein the magnitude of the threshold voltage of the fourth and fifth transistors is larger than the magnitude of the threshold voltage of any of the second and third transistors.

11. The semiconductor integrated circuit of claim 1, wherein the magnitude of the threshold voltage of the fourth transistor is smaller than the magnitude of the threshold voltage of the fifth transistor.

12. A semiconductor integrated circuit comprising:
first and second output circuits;
first and second decode circuits each for determining whether or not an input value matches with a predetermined value and outputting the determination result; and
first and second delay circuits,
wherein the first output circuit comprises:
a first transistor of a first conductivity type connected between a first power supply and a first output node, the first transistor being turned ON according to a first clock to put the first output node to a first logic level;
a second transistor of a second conductivity type, the second transistor being turned ON according to a signal indicating the determination result from the first decode circuit;
a third transistor of the second conductivity type connected in series to the second transistor, the third transistor being turned ON according to a second clock;
a fourth transistor of the first conductivity type connected between the first power supply and the first output node, the fourth transistor being turned ON according to a first feedback signal;
a first inverter for inverting the logic level of the first output node and outputting the inverted signal; and
a fifth transistor of the first conductivity type connected between the first power supply and the first output node, the fifth transistor being turned ON according to the output of the first inverter or the signal indicating the determination result from the first decode circuit,
the second and third transistors being connected between the first output node and a second power supply,
wherein the second output circuit comprises:
a sixth transistor of the first conductivity type connected between the first power supply and a second output node, the sixth transistor being turned ON according to the first clock to put the second output node to the first logic level;
a seventh transistor of the second conductivity type, the seventh transistor being turned ON according to a signal indicating the determination result from the second decode circuit;
an eighth transistor of the second conductivity type connected in series to the seventh transistor, the eighth transistor being turned ON according to the second clock;
a ninth transistor of the first conductivity type connected between the first power supply and the second output node, the ninth transistor being turned ON according to a second feedback signal;
a second inverter for inverting the logic level of the second output node and outputting the inverted signal; and
a tenth transistor of the first conductivity type connected between the first power supply and the second output node, the tenth transistor being turned ON according to the output of the second inverter or the signal indicating the determination result from the second decode circuit,
the seventh and eighth transistors being connected between the second output node and the second power supply, and
wherein the first delay circuit delays the signal indicating the determination result from the first decode circuit and outputs the delayed signal as the second feedback signal, and
the second delay circuit delays the signal indicating the determination result from the second decode circuit and outputs the delayed signal as the first feedback signal.

13. The semiconductor integrated circuit of claim 12, wherein the first delay circuit inverts the logic of the signal indicating the determination result from the first decode circuit and outputs the inverted signal, and
the second delay circuit inverts the logic of the signal indicating the determination result from the second decode circuit and outputs the inverted signal.

14. The semiconductor integrated circuit of claim 12, wherein the values with which the determination is made in the first and second decode circuits are values adjacent to each other.

15. The semiconductor integrated circuit of claim 12, wherein the second delay circuit outputs the first feedback signal so that the fourth transistor is turned OFF after both the second and third transistors are turned ON.

16. The semiconductor integrated circuit of claim 12, wherein the first decode circuit comprises:
an eleventh transistor of the first conductivity type connected between the first power supply and a decode output node at which the signal indicating the determination result from the first decode circuit is output, the eleventh transistor is being turned ON according to a third clock synchronizing with the first clock to put the decode output node to the first logic level;

a twelfth transistor of the second conductivity type, the twelfth transistor being turned ON according to the third clock; and a parallel circuit having a plurality of transistors of the second conductivity type connected in parallel, the parallel circuit being connected in series to the twelfth transistor, the parallel circuit not being turned ON if the input value matches with the predetermined value and otherwise being turned ON, and the twelfth transistor and the parallel circuit are connected between the decode output node and the second power supply.

17. The semiconductor integrated circuit of claim 16, wherein it takes shorter time to shift the potential from the first logic level to a second logic level inverted from the first logic level in the decode output node than in the first output node.

18. The semiconductor integrated circuit of claim 16, wherein the fifth transistor is turned ON according to the output of the first inverter, and the sum of the gate widths of the fourth and fifth transistors is one-fifth or less of the sum of the gate widths of the second and third transistors.

19. The semiconductor integrated circuit of claim 12, wherein the fifth transistor is turned ON according to the output of the first inverter, and the gate width of the fourth transistor is equal to or more than the gate width of the fifth transistor.

20. The semiconductor integrated circuit of claim 12, wherein the fifth transistor is turned ON according to the signal indicating the determination result from the first decode circuit, and the gate width of the fourth transistor is one-fifth or less of the sum of the gate widths of the second and third transistors.

21. The semiconductor integrated circuit of claim 12, wherein the fifth transistor is turned ON according to the output of the first inverter, and the gate oxide thickness of the fourth and fifth transistors is larger than the gate oxide thickness of any of the second and third transistors.

22. The semiconductor integrated circuit of claim 12, wherein the fifth transistor is turned ON according to the output of the first inverter, and the gate oxide thickness of the fourth transistor is smaller than the gate oxide thickness of the fifth transistor.

23. The semiconductor integrated circuit of claim 12, wherein the fifth transistor is turned ON according to the signal indicating the determination result from the first decode circuit, and the gate oxide thickness of the fourth transistor is larger than the gate oxide thickness of any of the second and third transistors.

24. The semiconductor integrated circuit of claim 12, wherein the fifth transistor is turned ON according to the output of the first inverter, and the magnitude of the threshold voltage of the fourth and fifth transistors is larger than the magnitude of the threshold voltage of any of the second and third transistors.

25. The semiconductor integrated circuit of claim 12, wherein the fifth transistor is turned ON according to the output of the first inverter, and the magnitude of the threshold voltage of the fourth transistor is smaller than the magnitude of the threshold voltage of the fifth transistor.

26. The semiconductor integrated circuit of claim 12, wherein the fifth transistor is turned ON according to the signal indicating the determination result from the first decode circuit, and the magnitude of the threshold voltage of the fourth transistor is larger than the magnitude of the threshold voltage of any of the second and third transistors.

27. A semiconductor integrated circuit comprising:

first, second and third output circuits;

first, second and third decode circuits each for determining whether or not an input value matches with a predetermined value and outputting the determination result; and first and second delay circuits, wherein the first output circuit comprises:

a first transistor of a first conductivity type connected between a first power supply and a first output node, the first transistor being turned ON according to a first clock to put the first output node to a first logic level;

a second transistor of a second conductivity type, the second transistor being turned ON according to a signal indicating the determination result from the first decode circuit;

a third transistor of the second conductivity type connected in series to the second transistor, the third transistor being turned ON according to a second clock;

a fourth transistor of the first conductivity type connected between the first power supply and the first output node, the fourth transistor being turned ON according to a first feedback signal;

a first inverter for inverting the logic level of the first output node and outputting the inverted signal; and a fifth transistor of the first conductivity type connected between the first power supply and the first output node, the fifth transistor being turned ON according to the output of the first inverter or the signal indicating the determination result from the first decode circuit, the second and third transistors being connected between the first output node and a second power supply, wherein the second output circuit comprises:

a sixth transistor of the first conductivity type connected between the first power supply and a second output node, the sixth transistor being turned ON according to the first clock to put the second output node to the first logic level;

a seventh transistor of the second conductivity type, the seventh transistor being turned ON according to a signal indicating the determination result from the second decode circuit;

an eighth transistor of the second conductivity type connected in series to the seventh transistor, the eighth transistor being turned ON according to the second clock;

a ninth transistor of the first conductivity type connected between the first power supply and the second output node, the ninth transistor being turned ON according to a second feedback signal;

a second inverter for inverting the logic level of the second output node and outputting the inverted signal; and a tenth transistor of the first conductivity type connected between the first power supply and the second output node, the tenth transistor being turned ON according to the output of the second inverter or the signal indicating the determination result from the second decode circuit, the seventh and eighth transistors being connected between the second output node and the second power supply, wherein the third output circuit comprises:
an eleventh transistor of the first conductivity type connected between the first power supply and a third output node, the eleventh transistor being turned ON according to the first clock to put the third output node to the first logic level;
a twelfth transistor of the second conductivity type, the twelfth transistor being turned ON according to a signal indicating the determination result from the third decode circuit;
a thirteenth transistor of the second conductivity type connected in series to the twelfth transistor, the thirteenth transistor being turned ON according to the second clock;
a fourteenth transistor of the first conductivity type connected between the first power supply and the third output node, the fourteenth transistor being turned ON according to a third feedback signal;
a third inverter for inverting the logic level of the third output node and outputting the inverted signal; and
a fifteenth transistor of the first conductivity type connected between the first power supply and the third output node, the fifteenth transistor being turned ON according to the output of the third inverter or the signal indicating the determination result from the third decode circuit,
the twelfth and thirteenth transistors being connected between the third output node and the second power supply, and
wherein the first delay circuit delays the signal indicating the determination result from the first decode circuit and outputs the delayed signal as the second feedback signal, and
the second delay circuit delays the signal indicating the determination result from the second decode circuit and outputs the delayed signal as the third feedback signal.

28. The semiconductor integrated circuit of claim 27, wherein the first delay circuit inverts the logic of the signal indicating the determination result from the first decode circuit and outputs the inverted signal, and
the second delay circuit inverts the logic of the signal indicating the determination result from the second decode circuit and outputs the inverted signal.

29. The semiconductor integrated circuit of claim 27, wherein the values with which the determination is made in the first to third decode circuits are values sequentially different by one each.

30. The semiconductor integrated circuit of claim 27, wherein the first delay circuit outputs the second feedback signal so that the ninth transistor is turned OFF after both the seventh and eighth transistors are turned ON.

31. The semiconductor integrated circuit of claim 27, wherein the second decode circuit comprises:
an sixteenth transistor of the first conductivity type connected between the first power supply and a decode output node at which the signal indicating the determination result from the second decode circuit is output, the sixteenth transistor being turned ON according to a third clock synchronizing with the first clock to put the decode output node to the first logic level;
a seventeenth transistor of the second conductivity type, the seventeenth transistor being turned ON according to the third clock; and
a parallel circuit having a plurality of transistors of the second conductivity type connected in parallel, the parallel circuit being connected in series to the seventeenth transistor, the parallel circuit not being turned ON if the input value matches with the predetermined value and otherwise being turned ON, and
the seventeenth transistor and the parallel circuit are connected between the decode output node and the second power supply.

32. The semiconductor integrated circuit of claim 31, wherein it takes shorter time to shift the potential from the first logic level to a second logic level inverted from the first logic level in the decode output node than in the second output node.

33. The semiconductor integrated circuit of claim 27, wherein the tenth transistor is turned ON according to the output of the second inverter, and
the sum of the gate widths of the ninth and tenth transistors is one-fifth or less of the sum of the gate widths of the seventh and eighth transistors.

34. The semiconductor integrated circuit of claim 27, wherein the tenth transistor is turned ON according to the output of the second inverter, and
the gate width of the ninth transistor is equal to or more than the gate width of the tenth transistor.

35. The semiconductor integrated circuit of claim 27, wherein the tenth transistor is turned ON according to the signal indicating the determination result from the second decode circuit, and
the gate width of the ninth transistor is one-fifth or less of the sum of the gate widths of the seventh and eighth transistors.

36. The semiconductor integrated circuit of claim 27, wherein the tenth transistor is turned ON according to the output of the second inverter, and
the gate oxide thickness of the ninth and tenth transistors is larger than the gate oxide thickness of any of the seventh and eighth transistors.

37. The semiconductor integrated circuit of claim 27, wherein the tenth transistor is turned ON according to the output of the second inverter, and
the gate oxide thickness of the ninth transistor is smaller than the gate oxide thickness of the tenth transistor.

38. The semiconductor integrated circuit of claim 27, wherein the tenth transistor is turned ON according to the signal indicating the determination result from the second decode circuit, and
the gate oxide thickness of the ninth transistor is larger than the gate oxide thickness of any of the seventh and eighth transistors.

39. The semiconductor integrated circuit of claim 27, wherein the tenth transistor is turned ON according to the output of the second inverter, and
the magnitude of the threshold voltage of the ninth and tenth transistors is larger than the magnitude of the threshold voltage of any of the seventh and eighth transistors.

40. The semiconductor integrated circuit of claim 27, wherein the tenth transistor is turned ON according to the output of the second inverter, and
the magnitude of the threshold voltage of the ninth transistor is smaller than the magnitude of the threshold voltage of the tenth transistor.

41. The semiconductor integrated circuit of claim 27, wherein the tenth transistor is turned ON according to the signal indicating the determination result from the second decode circuit, and
the magnitude of the threshold voltage of the ninth transistor is larger than the magnitude of the threshold voltage of any of the seventh and eighth transistors.

* * * * *